US007586380B1

(12) United States Patent
Natarajan et al.

(10) Patent No.: US 7,586,380 B1
(45) Date of Patent: Sep. 8, 2009

(54) BIAS CIRCUIT TO STABILIZE OSCILLATION IN RING OSCILLATOR, OSCILLATOR, AND METHOD TO STABILIZE OSCILLATION IN RING OSCILLATOR

(75) Inventors: Ananda S. Natarajan, Bangalore (IN); Jithin Janardhan, Bangalore (IN)

(73) Assignee: Kawasaki Microelectronics, Inc., Chiba (JP)

( * ) Notice: Subject to any disclaimer, the term of this patent is extended or adjusted under 35 U.S.C. 154(b) by 21 days.

(21) Appl. No.: 12/073,958

(22) Filed: Mar. 12, 2008

(51) Int. Cl.
*H03B 5/24* (2006.01)
*H03K 3/03* (2006.01)
*H03L 1/00* (2006.01)
*H03L 1/02* (2006.01)

(52) U.S. Cl. .......................... 331/57; 331/176; 331/186

(58) Field of Classification Search .................. 331/57, 331/66, 175, 176, 185, 186
See application file for complete search history.

(56) References Cited

U.S. PATENT DOCUMENTS 5,264,785 A 11/1993 Greason
5,359,301 A 10/1994 Candage
5,412,349 A 5/1995 Young et al.
5,440,277 A 8/1995 Ewen et al.
5,767,748 A 6/1998 Nakao
5,847,616 A 12/1998 Ng et al.
6,271,711 B1 * 8/2001 Shenoy ....................... 327/530
6,954,110 B2 10/2005 Li
2007/0103242 A1 5/2007 Wu

FOREIGN PATENT DOCUMENTS

JP 5-327425 10/1993

OTHER PUBLICATIONS

K. Sundaresan, P. E. Allen, and F. Ayazi, "Process and Temperature Compensation in a 7-MHz CMOS Clock Oscillator", IEEE J. Solid-State Circuits, vol. 41, No. 2, pp. 433-442, Feb. 2006.
Yang-Shyung Shyu and Jiin-Chuan Wu, "A process and temperature compensated ring oscillator", the First IEEE Asia Pacific Conference on ASICs, 1999 (AP-ASIC '99), pp. 283-286.
G. Moon, M. E. Zaghloul, and R. W. Newcomb, "An Enhancement-mode MOS Voltage-Controlled Linear Resistor with Large Dynamic Range", IEEE Trans. Circuits and Systems, vol. 37, No. 10, pp. 1284-1288, Oct. 1990.
John G. Maneatis, "Low-Jitter Process-Independent DLL and PLL Based on Self-Biased Techniques", IEEE J. Solid-State Circuits, vol. 31, No. 11, pp. 1723-1732, Nov. 1996.
Stephen Docking and Manoj Sachdev, "A Method to Derive an Equation for the Oscillation Frequency of a Ring Oscillator", IEEE Trans. Circuits and Systems, vol. 50, No. 2, pp. 259-264, Feb. 2003.

* cited by examiner

*Primary Examiner*—David Mis
(74) *Attorney, Agent, or Firm*—Oliff & Berridge, PLC

(57) ABSTRACT

Bias circuits to stabilize oscillation in ring oscillators, oscillators, and methods to stabilize oscillation in ring oscillators are provided. The ring oscillator includes a plurality of differential delay cells, each including a pair of input transistors, a pair of voltage-controlled resistors, and a common current source. The bias circuit includes a replica arm that includes a replica of one of the voltage-controlled resistors, and a resistor arm that includes a fixed resistor. The bias circuit supplies bias voltages to the differential delay cells such that ratio of voltage swing to bias current of the delay cell is kept constant by referring the ratio to the fixed resistor.

21 Claims, 4 Drawing Sheets

BIAS CIRCUIT TO STABILIZE OSCILLATION IN RING OSCILLATOR, OSCILLATOR, AND METHOD TO STABILIZE OSCILLATION IN RING OSCILLATOR

BACKGROUND

This invention relates to integrated circuit oscillators using CMOS processes. More specifically, this invention relates to bias circuits to stabilize oscillation in ring oscillators and to oscillators that generate output frequencies that remain stable independent of process, temperature, and supply voltage variations. This invention also relates to methods to stabilize oscillation in ring oscillators.

Oscillators are used for timing controls in various applications. Usually, crystal based oscillators are used where frequency accuracy is very critical. Non-crystal oscillators show huge variations in frequency due to variations in device parameters with temperature, process, and supply voltage. There is a need for non-crystal, standalone oscillators with a fairly good level of frequency stability where the conditions are not so stringent as to necessitate the use of crystal based oscillators.

For example, K. Sundaresan, P. E. Allen, and F. Ayazi, "Process and Temperature Compensation in a 7-MHz CMOS Clock Oscillator", IEEE J. Solid-State Circuits, vol. 41, no. 2, pp. 433-442, February 2006, and Yang-Shyung Shyu and Jiin-Chuan Wu, "A process and temperature compensated ring oscillator", the First IEEE Asia Pacific Conference on ASICs, 1999 (AP-ASIC '99), pp. 283-286, which are incorporated by reference in their entireties, make use of bandgap reference circuits and other BJT based compensation circuits to compensate for oscillator frequency variations. Such BJT based compensation circuits are not only large in area but also involve complex processing steps which make them unfeasible in simple CMOS processes. A reference clock is also used in some cases to stabilize the output frequency. Further, these compensation circuits require precise tuning of various parameters and/or do not ensure sufficiently high frequency stability.

SUMMARY

Various exemplary embodiments aim to solve the problems described above. The exemplary embodiments provide bias circuits and methods to stabilize oscillation in ring oscillators, i.e., to suppress the dependency of oscillation frequency on process, temperature, and supply voltage, using only basic CMOS processes, without using special devices like BJTs, inductors, etc. The exemplary embodiments also provide oscillators with stabilized oscillation without using special devices.

In order to address the above, various exemplary embodiments provide a bias circuit to stabilize oscillation in a ring oscillator that includes a plurality of differential delay cells having respective pairs of input nodes and output nodes and connected in series to form a ring. Each of the differential delay cells includes a pair of input transistors having gates connected to respective ones of the input nodes, sources coupled with each other, and drains connected to respective ones of the output nodes, a pair of voltage-controlled resistors connected between a power-supply line and respective ones of the output nodes, and a common current source that supplies a bias current controlled by a second bias voltage to the pair of input transistors. Each of the voltage-controlled resistors has an effective resistance dependent on a first bias voltage. The bias circuit includes a replica arm that includes a replica of one of the voltage-controlled resistors connected between the power-supply line and a first control node, and a first replica of the common current source that supplies a first replica bias current controlled by the second bias voltage to the replica of one of the voltage-controlled resistors; a resistor arm that includes a fixed resistor connected between the power-supply line and a second control node, and a second replica of the common current source that supplies a second replica bias current controlled by the second bias voltage to the fixed resistor; and a control circuit that adjusts the second bias voltage such that voltages at the first and the second control nodes are the same. The bias circuit supplies to the differential delay cells the first bias voltage from one of the first and the second control nodes and the second bias voltage from the control circuit.

According to various other embodiments, the second replica bias current may be larger than the first replica bias current. According to various still other embodiments, the delay cells and the bias circuit, except for the fixed resistor, may be integrated in a single integrated circuit chip, and the fixed resistor may be provided as an off-chip resistor.

In order to address the above, various exemplary embodiments provide an oscillator that includes a ring oscillator and a bias circuit. The ring oscillator includes a plurality of differential delay cells having respective pairs of input nodes and output nodes and connected in series to form a ring. Each of the differential delay cells includes a pair of input transistors having gates connected to respective ones of the input nodes, sources coupled with each other, and drains connected to respective ones of the output nodes; a pair of voltage-controlled resistors connected between a power-supply line and respective ones of the output nodes; and a common current source that supplies a bias current controlled by a second bias voltage to the pair of input transistors. Each of the voltage-controlled resistors has an effective resistance dependent on a first bias voltage. The bias circuit includes a replica arm that includes a replica of one of the voltage-controlled resistors connected between the power-supply line and a first control node, and a first replica of the common current source that supplies a first replica bias current controlled by the second bias voltage to the replica of one of the voltage-controlled resistors; a resistor arm that includes a fixed resistor connected between the power-supply line and a second control node, and a second replica of the common current source that supplies a second replica bias current controlled by the second bias voltage to the fixed resistor; and a control circuit that adjusts the second bias voltage such that voltages at the first and the second control nodes are the same. The bias circuit supplies to the differential delay cells the first bias voltage from one of the first and the second control nodes and the second bias voltage from the control circuit.

In order to address the above, various exemplary embodiments provide a single-chip oscillator including a single semiconductor integrated circuit chip, a ring oscillator integrated in the single integrated circuit chip, and a bias circuit integrated in the single integrated circuit chip. The bias circuit includes a replica arm that includes a replica of one of the voltage-controlled resistors connected between the power-supply line and a first control node, and a first replica of the common current source that supplies a first replica bias current controlled by the second bias voltage to the replica of one of the voltage-controlled resistors; a resistor arm that includes a pair of terminals to connect an off-chip fixed resistor between the power-supply line and a second control node, and a second replica of the common current source that supplies a second replica bias current controlled by the second bias voltage to the off-chip fixed resistor; and a control circuit that adjusts the second bias voltage such that voltages at the first and the second control nodes are the same, In order to address the above, various exemplary embodiments provide a method to stabilize oscillation in a ring oscillator that includes a plurality of differential delay cells having respective pairs of input nodes and output nodes and connected in series to form a ring. Each of the differential delay cells includes a pair of input transistors having gates connected to respective ones of the input nodes, sources coupled with each other, and drains connected to respective ones of the output nodes, a pair of voltage-controlled resistors connected between a power-supply line and respective ones of the output nodes, and a common current source that supplies a bias current controlled by a second bias voltage to the pair of input transistors. Each of the voltage-controlled resistors has an effective resistance dependent on a first bias voltage. The method includes providing a bias circuit including a replica arm that includes a replica of one of the voltage-controlled resistors connected between the power-supply line and a first control node, and a first replica of the common current source that supplies a first replica bias current controlled by the second bias voltage to the replica of one of the voltage-controlled resistors; a resistor arm that includes a fixed resistor connected between the power-supply line and a second control node, and a second replica of the common current source that supplies a second replica bias current controlled by the second bias voltage to the fixed resistor. The method further includes adjusting the second bias voltage such that voltages at the first and the second control nodes are the same, and supplying to the differential delay cells the first bias voltage from one of the first and the second control nodes and the adjusted second bias voltage.

In order to address the above, various exemplary embodiments provide a method to stabilize oscillation in a ring oscillator comprising a plurality of differential delay cells having respective pairs of input nodes and output node and connected in series to form a ring. The method includes providing a bias circuit including a replica arm that includes a replica of one of the voltage-controlled resistors connected between the power-supply line and a first control node, and a first replica of the common current source that supplies a first replica bias current controlled by the second bias voltage to the replica of one of the voltage-controlled resistors. The method further includes adjusting the second bias voltage such that an effective resistance of the replica of one of the voltage-controlled resistors is equal to a predetermined value, and supplying to the differential delay cells the first bias voltage from the first control node and the adjusted second bias voltage.

BRIEF DESCRIPTION OF DRAWINGS

Various exemplary details of bias circuits, oscillators, and methods to stabilize oscillation are described with reference to the following figures, wherein.

DETAILED DESCRIPTION OF EMBODIMENTS

Figure 1:
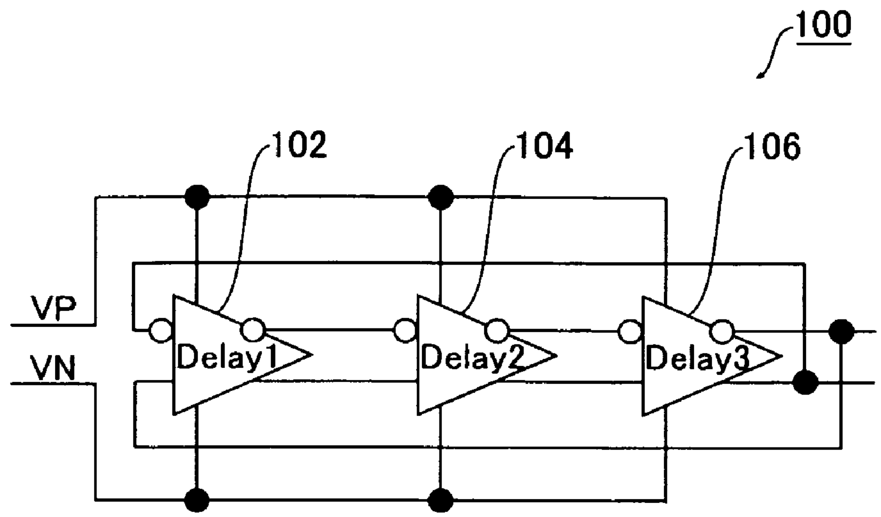
FIG. 1 shows a schematic construction of an exemplary ring oscillator.

FIG. 1 illustrates a three-stage ring oscillator 100 based on differential delay cells, Delay 1 102, Delay 2 104, and Delay 3 106, which are connected in series to form a ring.

Figure 2:
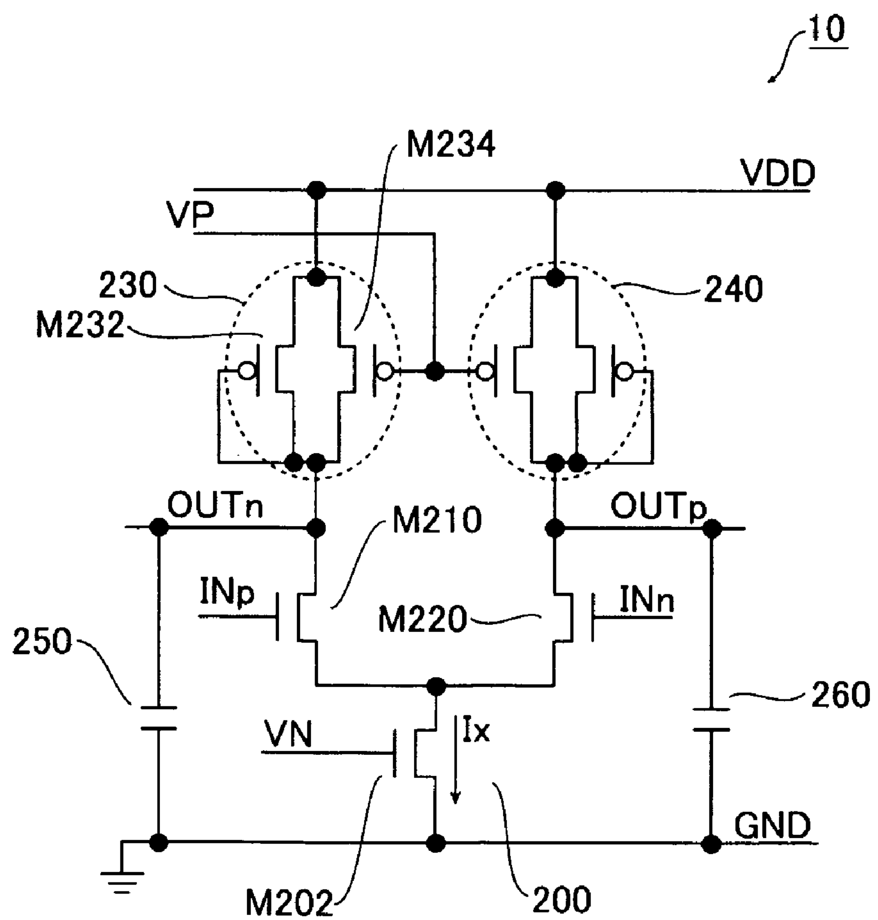
FIG. 2 shows an exemplary delay cell to be used in the exemplary ring oscillator.

An exemplary delay cell 10 is illustrated in FIG. 2. Input NMOS transistors M210 and M220 form a differential pair. The input transistors M210 and M220 have gates connected to input nodes INp and INn, respectively, sources coupled with each other, and drains connected to output nodes OUTn and OUTp, respectively. A common bias current source 200 constructed with a NMOS transistor M202, whose gate is biased at a bias voltage VN, is provided between sources of the input transistors and the GND power-supply line. Thus, the common bias current source 200 supplies a bias current Ix, which is controlled by the bias voltage VN, to the pair of input transistors M210 and M220. The bias current Ix is switched between the two arms of each differential pair as the oscillator runs and these currents charge and discharge the load capacitors 250 and 260 at the output nodes OUTn and OUTp. The capacitive loads 250 and 260 may be, for example, MOS capacitors connected to ground GND.

Each arm of the differential pair has a symmetrical load 230 or 240 connected between the VDD power-supply line and the output node OUTn or OUTp. Each of the symmetrical loads 230 and 240 includes two transistors; a diode-connected PMOS transistor M232 connected in parallel with another PMOS transistor M234 whose gate is biased at a bias voltage VP, which together provide better linearity as compared to a single transistor. An effective resistance of the symmetrical load 230 or 240 (i.e., a ratio of voltage drop across the load and bias current flowing in the load) varies depending on the bias voltage VP. Thus, the symmetrical load operates as a voltage-controlled resistor having an effective resistance controlled by the bias voltage VP.

Analyses of operations of the symmetrical load are provided in, for example, G. Moon, M. E. Zaghloul, and R. W. Newcomb, "An Enhancement-mode MOS Voltage-Controlled Linear Resistor with Large Dynamic Range", IEEE Trans. Circuits and Systems, vol. 37, no. 10, pp. 1284-1288, October 1990, and John G. Maneatis, "Low-Jitter Process-Independent DLL and PLL Based on Self-Biased Techniques", IEEE J. Solid-State Circuits, vol. 31, no. 11, pp. 1723-1732, November 1996, which are incorporated by reference in their entireties.

Figure 3:
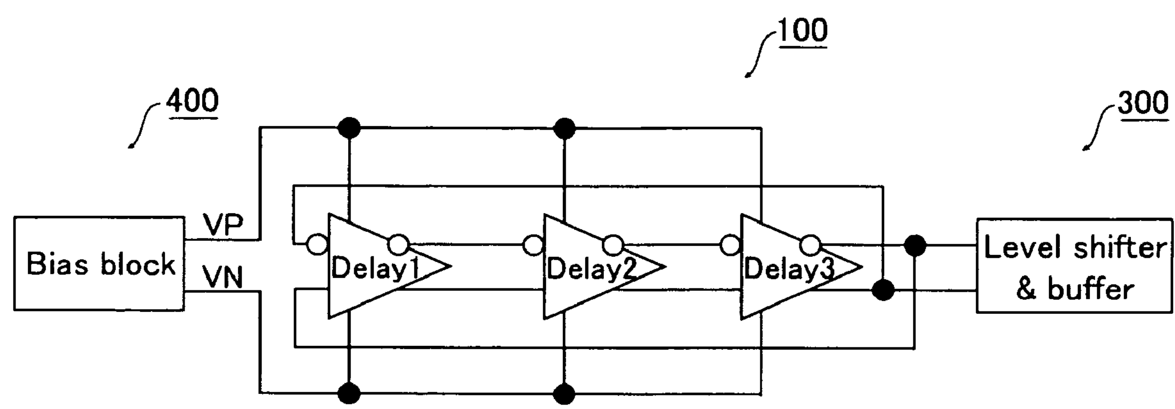
FIG. 3 shows an exemplary block diagram of an oscillator including a ring oscillator and a bias block.

The design of a complete oscillator based on this scheme is shown in FIG. 3. The bias block 400 supplies bias voltages VP and VN to the ring oscillator 100. The level shifter and buffer 300 outputs the oscillation signal to various blocks (not shown) integrated within a semiconductor integrated circuit.

Now, referring to FIG. 1 and FIG. 2, operation of ring oscillator 100 will be explained. If each delay cell 10 has sufficient gain, then the circuit will oscillate because of positive feedback. When a signal with a voltage level of VDD is supplied to the input node INp of the delay cell 10, corresponding input NMOS transistor M210 is turned on completely and draws all the bias current Ix through it. This results in a voltage drop of VDD-VP across its corresponding symmetrical load 230, and an output voltage of VP is output from the corresponding output node OUTn. In other words, the bias voltages VN and VP are set such that a voltage drop of VDD-VP is developed when all the bias current Ix flows through one of the symmetrical loads.

Similarly, when a signal with a voltage level of VP is supplied to the input node INp, then the input NMOS transistor M210 is cut-off (weekly on) and all the bias current Ix flows through the other arm. This results in an output of VDD from the output node OUTn. Thus, the output nodes OUTp and OUTn of each delay cell 10 swing between VDD and VP.

The delay of each cell is a function of output voltage swing, bias current, input transistor transconductance, and capacitive and resistive loads at the output nodes. Thus, the frequency of oscillation is a complex function of voltage swing, capacitive load, resistive load, bias current, and input transistor transconductance. However, to a good approximation, this frequency of oscillation is given by the following equation.

$$Fosc = \frac{Ix}{2N \cdot (VDD - VP) \cdot Cp} \quad (1)$$

Where,

Ix is the bias current in each stage

N is the number of stages

Cp is the capacitance at each output node.

This frequency is a function of number of stages, voltage swing, bias current, and load capacitance of each delay cell. Among the above-mentioned parameters, voltage swing and bias current will vary with process, temperature, and supply voltage variation. However, equation (1) indicates that the output frequency of this oscillator 100 is controlled by setting bias current Ix and voltage swing VDD-VP.

Figure 4:
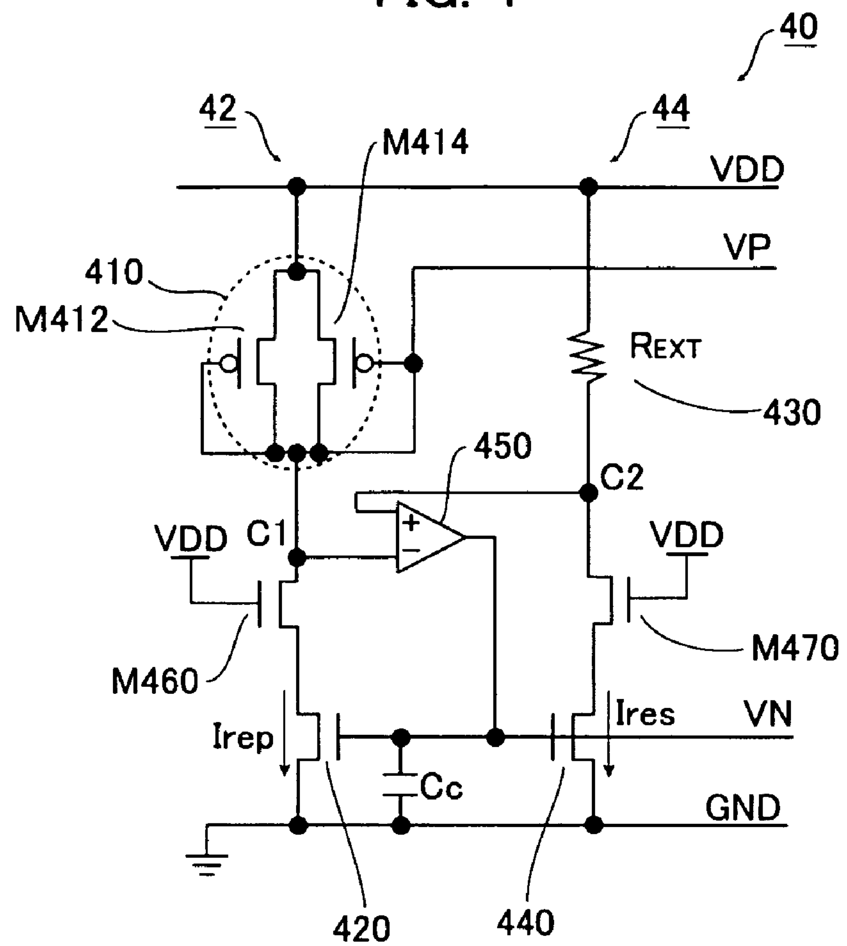
FIG. 4 shows an exemplary bias circuit that may be incorporated in the bias block.

In accordance with various exemplary embodiments of this invention, the ratio of voltage swing to bias current can be kept constant using a bias circuit provided in the bias block 400 that supplies bias voltages VP and VN to the delay cells 10. FIG. 4 shows an exemplary embodiment of the bias circuit. The exemplary bias circuit 40 includes a replica arm 42 and a resistor arm 44.

The replica arm 42 is shown on the left and includes a symmetrical load 410 connected between the VDD power-supply line and a node C1 (first control node) and a current source 420 that supplies a bias current Irep to the symmetrical load 410. This arm may be an exact replica of an arm of a delay cell 10. That is, the current source 420 of the replica arm 42 may be constructed with a NMOS transistor having the same size as that of the transistor M202 in the delay cell 10. And the symmetrical load 410 of the replica arm 42 may be constructed with two PMOS transistors M412 and M414 having the same sizes as those of the transistors that construct the symmetrical loads 230 and 240 of the delay cell 10. In this case, the bias current of the replica arm Irep is equal to the bias current Ix of the delay cell 10, because the same bias voltage VN is supplied to the current source transistor of the replica arm 42 and that of the delay cell 10.

The replica arm 42 can be made with different transistor sizes but the bias current Irep needs to be changed proportionately. For example, if replica transistors that are half the size of the transistors in the delay cell are used, then the bias current is also reduced by half. Because the same bias voltage VN is supplied to the current source transistor of the replica arm 42 and that of the delay cell 10, the bias current can be reduced or increased in proportion to a ratio of sizes of the current source transistors.

As explained above, a voltage drop of VDD-VP is developed across the symmetrical load in an arm of the delay cell 10 when all the bias current flows in that arm. Thus, the replica arm 42 generates the bias voltage VP at the node C1 to which one of the terminals of the symmetrical load 410 is connected. Specifically, in the exemplary embodiment shown in FIG. 4, the drain of the transistor M414, whose gate is biased with the bias voltage VP, is connected to the node C1 that generates the bias voltage VP.

On the other hand, the resistor arm 44 includes an off-chip resistor 430 (or an external resistor $R_{EXT}$) connected between the VDD power-supply line and a node C2 (second control node) and a mirror current source 440. The mirror current source 440 mirrors the current flowing in the replica arm Irep into the current Ires flowing in the resistor arm 44. Accordingly, the current in the resistor arm Ires is equal to or proportional to the current in the replica arm Irep and is also equal to or proportional to the current in the delay cell Ix.

In accordance with various exemplary embodiments of this invention, the bias circuit of FIG. 4 provides bias voltages VN to bias current transistor M202 and VP to symmetrical loads 230 and 240 in the delay cells 10 of FIG. 2, such that the ratio of output voltage swing to bias current is maintained constant. This circuit achieves the same by referring the ratio of voltage swing and bias current to the off-chip resistor 430. Bias current is mirrored using current source 440. Voltage drop across the off-chip resistor 430 and voltage drop across the replica of the symmetrical load 410 are forced to be equal by using a control circuit including an op-amp 450 in feedback.

Specifically, in the exemplary bias circuit 40, op-amp 450 adjusts bias voltage VN such that voltages at the first control node C1 in the replica arm 42 and the second control node C2 in the resistor arm 44 are the same. In other words, op-amp 450 adjusts bias voltage VN such that an effective resistance of the symmetrical load 410 (i.e., a ratio of voltage drop across the load and bias current flowing in the load) is equal to a predetermined value, which is equal to or proportional to the value of off-chip resistor 430.

As thus explained, this bias circuit maintains the ratio of VDD-VP to the bias current for the symmetrical load equal to or proportional to the value of the external resistor. Now the bias current and voltage swing are related by the following equation.

$$Ires = \frac{VDD - VP}{R_{EXT}} = k \cdot Ix \quad (2)$$

The ratio of the size of the transistor in the mirror current source 440 in the resistor arm 44 and the size of bias current source transistor M202 in the delay cell 10 determine the constant k.

The exemplary bias circuit shown in FIG. 4 also contains two transistors 460 and 470, which are replicas of the input transistors M210 and M220 of each delay cell 10. Their gates are connected to VDD. They thus set the drain voltages of transistors in the current sources 420 and 440 to the same value as that of the current source transistor M202 in the delay cells when one of their arms carries all the bias current. This ensures that the replication of the delay cell arm by the bias circuit arm is very good and the bias currents in the delay cells 10 and those in the bias circuit 40 are now exactly matched.

From equations (1) and (2), the oscillating frequency of the oscillator is given by $$Fosc = \frac{Ix}{2N \cdot (VDD - VP) \cdot Cp} = \frac{1}{2N \cdot k \cdot R_{EXT} \cdot Cp} \quad (3)$$

In accordance with various exemplary embodiments of this invention, the frequency of oscillation now depends only on the value of external resistor 430 and the load capacitance at the output nodes of the delay cells 10. If we assume that external resistor is ideal, then the oscillation frequency is only a function of load capacitance.

A specific exemplary oscillator thus designed for 400 MHz output frequency using 0.13 μm CMOS 1.2V process, with NMOS capacitors 250 and 260 of a value ~200 fF, is very stable in frequency. A simulation shows a variation of only ±2%, including ±1% variation in the value of the off-chip resistor, within ±10% variation of power-supply voltage and −40 to 125° C. temperature variations. This oscillator occupies a very small area of around 100×50 μm and consumes 2 mA of maximum current. This architecture is independent of process technologies and output frequencies, and does not need any special components like BJTs, inductance, etc.

When the value of the capacitors 250 and 260 is relatively small, as in the case of the specific exemplary oscillator described above, the output frequency is also a function of parasitic capacitance at the output nodes of each delay cell. If the value of capacitors is very large compared to the value of parasitic capacitances at the output nodes, then the effect of parasitic capacitance variation on the frequency will be negligible. This may be feasible when frequency of oscillation required is not very high or if the restriction on total current drawn is not very stringent. The output frequency becomes further stable by using MIM (metal-insulator-metal) capacitors, because variation of a MIM capacitor is small across process, temperature, and supply voltage variations.

The exemplary embodiment described above utilizes an off-chip resistor, which is advantageous in minimizing the frequency variation. Other components in the bias circuit 40 may be integrated in a single integrated circuit chip in which the ring oscillator 100 including delay cells 10 is integrated, in order to ensure good replication of delay cell arms by the arms in the bias circuit 40. Thereby, a single-chip integrated circuit including the ring oscillator and the bias circuit, which has a pair of terminals (resistor terminals) to connect the off-chip resistor, is realized.

The external resistor can be replaced with an internal resistor, such as a poly resistor, and can be connected internally to the resistor terminals. Thereby, a single-chip integrated circuit including the ring oscillator and the bias circuit that requires no off-chip component is realized. Variation of output frequency of the oscillator with an internal resistor will follow the resistor variation.

Figure 5:
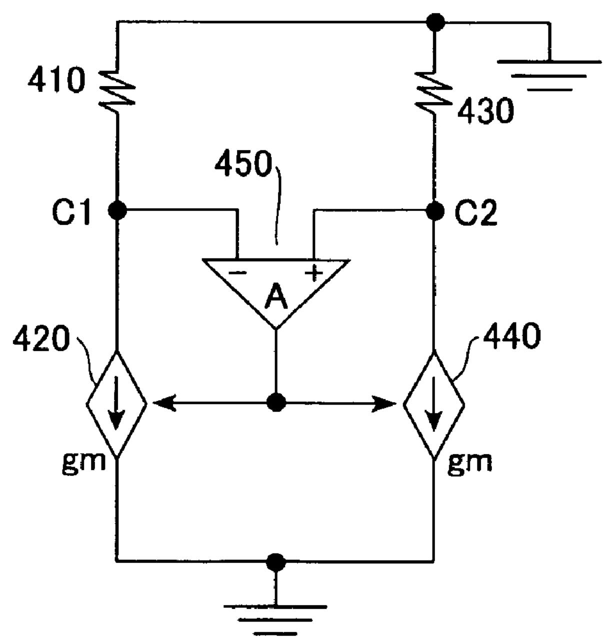
FIG. 5 shows a small signal equivalent circuit of an exemplary bias circuit shown in FIG. 4.

The bias circuit 40 of FIG. 4 includes two loops, one of which is a negative feedback loop formed between positive input of the op-amp 450 through VN and back to the positive input, and the other is a positive feedback loop formed between negative input of the op-amp 450 through VN and back to the negative input. Small signal equivalent circuit for this bias circuit is shown in FIG. 5. The circuit is designed such that the gain along the negative feedback loop is higher, thus giving a net negative feedback for the combined loop. To achieve higher gain for the negative feedback loop across all frequency until total gain drops to zero, the pole at the external resistor must be shifted far away from the positive loop. That is, roll off of the positive loop should happen earlier than that of the negative loop.

When an external resistor is connected at the second control node C2, the parasitic capacitance at that node may be as large as 30 pF's. This large capacitance, together with the external resistor, gives rise to a low frequency pole in the negative feedback loop. The negative feedback loop gain starts falling after this pole. This leads to net positive feedback with gain greater than unity. This effect may be compensated for by either moving the pole in the negative feedback loop to a higher frequency or by introducing an overall dominant pole in the combined loop. Reducing $R_{EXT}$ value and proportionately increasing the current through that arm may achieve the former. For this design, $R_{EXT}$ may be reduced by, for example, 10 times the effective resistance of symmetrical load and the current may be increased by 10 times. The latter method is shown in FIG. 4 where a capacitor Cc of value equal to, for example, 15 pF introduces the required dominant pole.

A supply coupling capacitor of a value of, for example, 15 pF may also be introduced between the VDD power-supply line and the bias line for supply bias voltage VP to the delay cells. Such a coupling capacitor helps in coupling supply voltage variation to the bias line and hence can reduce or prevent changes in the voltage swing.

The exemplary bias circuit 40 shown in FIG. 4 supplies bias voltage VP from the control node C1 in the replica arm 42. Because the op-amp 450 controls such that the voltage at the control node C1 in the replica arm 42 and the voltage at the control node C2 in the resistor arm 44 are the same, it is also possible to supply the bias voltage VP from the control node C2 in the resistor arm. In this case, the gate of transistor M414 in the replica arm 42 is also supplied with the bias voltage VP from the control node C2 in the resistor arm 44. Further, connections of input terminals of the op-amp 450 are reversed, i.e., the positive input terminal is connected to C1 and the negative input terminal is connected to C2.

In accordance with various exemplary embodiments of this invention, current sources in the delay cells can be made to have higher output impedance by using a cascade setup or by using transistors with significantly large length. This increases the validity of the approximate expression for the oscillation frequency, because the variation in bias current would be lower. A modification of the bias circuit to include a replica of the cascade current sources may be used.

Figure 6:
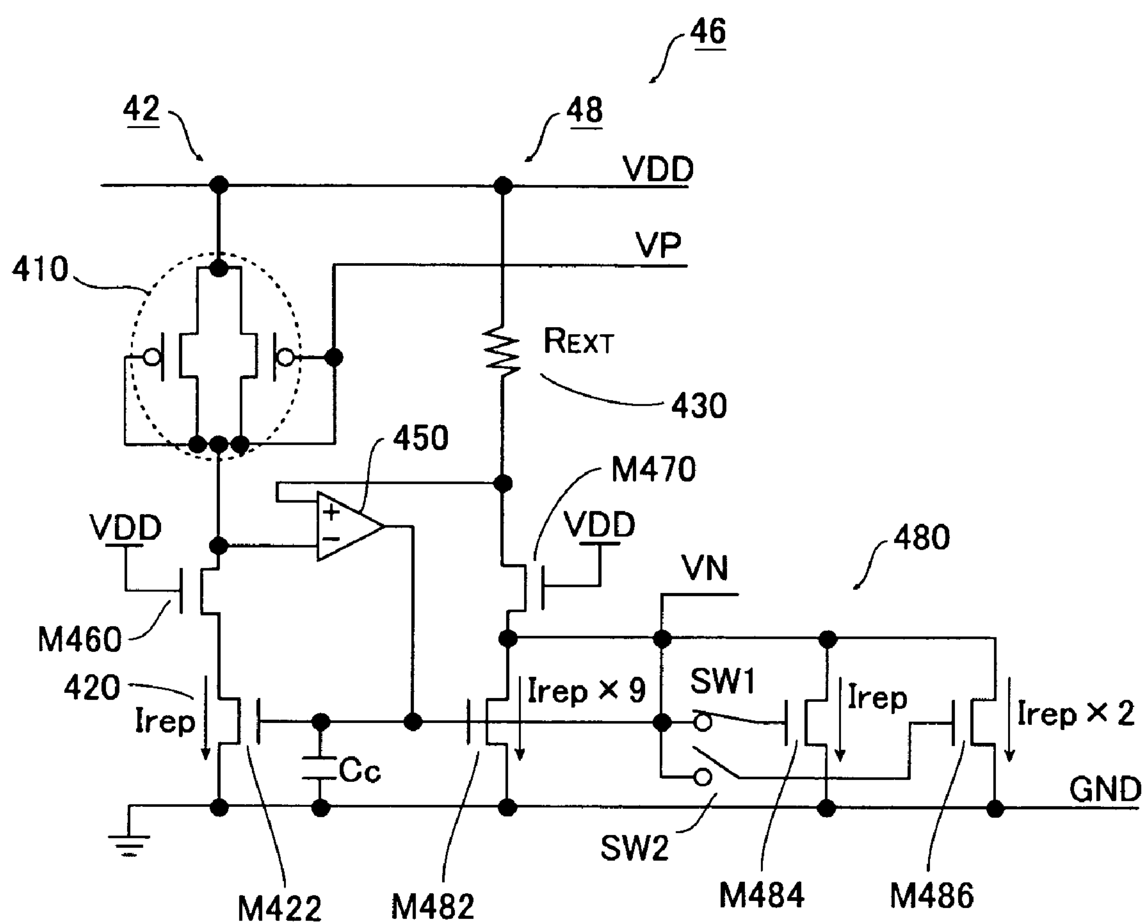
FIG. 6 shows another exemplary bias circuit.

FIG. 6 shows another exemplary embodiment of the bias circuit that can be included in the bias block 400. Different from the bias circuit 40 shown in FIG. 4, the resistor arm 48 of the bias circuit 46 shown in FIG. 6 includes switches SW1 and SW2 to adjust the bias current in the resistor arm. This feature may be used for frequency tuning after silicon (after manufacturing of the oscillator on a silicon substrate).

Specifically, the resistor arm 48 of the bias circuit 46 includes a bias current source 480 constructed with three current source transistors M482, M484, and M486. The size of the transistor M484 is the same as that of the current source transistor M422 in the current source 420 of the replica arm 42. The sizes of transistors M482 and M486 are nine-times and two-times larger than that of the transistor M422 in the current source 420, respectively. The gate of transistor M482 is always supplied with bias voltage VN. In default, SW1 to supply bias voltage VN to the gate of transistor M484 is ON, while SW2 to supply bias voltage VN to the gate of transistor M486 is OFF. Accordingly, a default value of the current through resistor arm 48 is made 10 times larger than that of replica arm 42 to make bias loop stable. If we turn off SW1, then the current in the resistor arm 48 decreases by 10% and the output frequency increases by 11%. If we turn on SW2, then the frequency reduces by 17%.

This feature of post silicon frequency tuning in the bias circuit 46 shown in FIG. 6 is explained in Table 1.

TABLE 1

| SW2 | SW1 | Output Frequency |
|---|---|---|
| 0 | 0 | Default + 11% |
| 0 | 1 | Default |
| 1 | 0 | Default − 9% |
| 1 | 1 | Default − 17% |

As thus explained, various exemplary embodiments of this invention provide one or more of the following advantages:

Oscillator output frequency is highly stable independent of process, supply voltage, and temperature. It depends only on the variation of the resistor.

This circuit can be scaled down or up to any technology.

Total layout area consumed by this circuit is very small.

This architecture does not need special devices like BJT, inductance, etc.

The exemplary delay cell shown in FIG. 3 employs symmetrical loads 230 and 240 each including two transistors; a diode-connected PMOS transistor in parallel with another PMOS transistor whose gate is biased at bias voltage VP, as voltage-controlled resistors. Various other types of voltage-controlled resistors may be employed. For example, the diode-connected PMOS transistor may be replaced with a diode-connected NMOS transistor as shown in, for example, FIG. 1B of U.S. Pat. No. 5,767,748, which is incorporated by reference in its entirety. When PMOS transistors are used as input transistors, a symmetrical load, which is connected between the GND power-supply line and an output node, may be constructed with a diode-connected NMOS transistor and another NMOS transistor whose gate is supplied with a bias voltage, such as shown in, for example, FIG. 3B of U.S. Pat. No. 5,767,748. In this case, the diode-connected NMOS transistor may be replaced with a diode-connected PMOS transistor. The diode-connected MOS transistor may be replaced with a resistor element as shown in, for example, FIG. 1 of U.S. Pat. No. 5,359,301, which is incorporated by reference in its entirety. On the other hand, an additional MOS transistor whose gate is biased at a bias voltage may by added in series with the diode-connected MOS transistor as shown in, for example, FIG. 3 of U.S. Pat. No. 5,847,616, which is incorporated by reference in its entirety. Furthermore, although it is preferable to construct the voltage-controlled resistor with a diode-connected MOS transistor and another MOS transistor whose gate is biased at a bias voltage in order to provide better linearity, it is also possible to construct the voltage-controlled resistor with a single transistor whose gate is biased at a bias voltage in some applications.

What is claimed is:

1. A bias circuit to stabilize oscillation in a ring oscillator comprising a plurality of differential delay cells having respective pairs of input nodes and output nodes and connected in series to form a ring, each of the differential delay cells comprising a pair of input transistors having gates connected to respective ones of the input nodes, sources coupled with each other, and drains connected to respective ones of the output nodes, a pair of voltage-controlled resistors connected between a power-supply line and respective ones of the output nodes, each of the voltage-controlled resistors having an effective resistance dependent on a first bias voltage, and a common current source that supplies a bias current controlled by a second bias voltage to the pair of input transistors, the bias circuit comprising:

a replica arm including a replica of one of the voltage-controlled resistors connected between the power-supply line and a first control node, and a first replica of the common current source that supplies a first replica bias current controlled by the second bias voltage to the replica of one of the voltage-controlled resistors;

a resistor arm including a fixed resistor connected between the power-supply line and a second control node, and a second replica of the common current source that supplies a second replica bias current controlled by the second bias voltage to the fixed resistor; and a control circuit that adjusts the second bias voltage such that voltages at the first and the second control nodes are the same, wherein the bias circuit supplies to the differential delay cells the first bias voltage from one of the first and the second control nodes and the second bias voltage from the control circuit.

2. The bias circuit of claim 1, wherein the second replica bias current is larger than the first replica bias current.

3. The bias circuit of claim 1, wherein:

the replica arm further includes a first replica of one of the input transistors through which the first replica of the common current source supplies the first replica bias current to the replica of one of the voltage-controlled resistors; and the resistor arm further includes a second replica of one of the input transistors through which the second replica of the common current source supplies the second replica bias current to the fixed resistor.

4. The bias circuit of claim 1, wherein the control circuit includes an operational amplifier having input terminals connected to respective ones of the first and the second control nodes and an output terminal that outputs the second bias voltage.

5. The bias circuit of claim 1, wherein the second replica of the common current source includes a switch to change a ratio between the second replica bias current and the bias current of the differential delay cell.

6. The bias circuit of claim 1, wherein the delay cells and the bias circuit, except for the fixed resistor, are integrated in a single integrated circuit chip, and the fixed resistor is provided as an off-chip resistor.

7. An oscillator comprising:

a ring oscillator comprising a plurality of differential delay cells having respective pairs of input nodes and output nodes and connected in series to form a ring, each of the differential delay cells comprising:

a pair of input transistors having gates connected to respective ones of the input nodes, sources coupled with each other, and drains connected to respective ones of the output nodes;

a pair of voltage-controlled resistors connected between a power-supply line and respective ones of the output nodes, each of the voltage-controlled resistors having an effective resistance dependent on a first bias voltage; and a common current source that supplies a bias current controlled by a second bias voltage to the pair of input transistors; and a bias circuit comprising:

a replica arm including a replica of one of the voltage-controlled resistors connected between the power-supply line and a first control node, and a first replica of the common current source that supplies a first replica bias current controlled by the second bias voltage to the replica of one of the voltage-controlled resistors;

a resistor arm including a fixed resistor connected between the power-supply line and a second control node, and a second replica of the common current source that supplies a second replica bias current controlled by the second bias voltage to the fixed resistor; and a control circuit that adjusts the second bias voltage such that voltages at the first and the second control nodes are the sane, wherein the bias circuit supplies to the differential delay cells the first bias voltage from one of the first and the second control nodes and the second bias voltage from the control circuit.

8. The ring oscillator of claim 7, wherein the second replica bias current is larger than the first replica bias current.

9. The ring oscillator of claim 7, wherein:

the replica arm further includes a first replica of one of the input transistors through which the first replica of the common current source supplies the first replica bias current to the replica of one of the voltage-controlled resistors; and;

the resistor arm further includes a second replica of one of the input transistors through which the second replica of the common current source supplies the second replica bias current to the fixed resistor.

10. The ring oscillator of claim 7, wherein the control circuit includes an operational amplifier having input terminals connected to respective ones of the first and the second control nodes and an output terminal that outputs the second bias voltage.

11. The ring oscillator of claim 7, wherein the second replica of the common current source includes a switch to change a ratio between the second replica bias current and the bias current of the differential delay cell.

12. The ring oscillator of claim 7, wherein the delay cells and the bias circuit, except for the fixed resistor, are integrated in a single integrated circuit chip, and the fixed resistor is provided as an off-chip resistor.

13. A single-chip oscillator comprising:

a single semiconductor integrated circuit chip;

a ring oscillator integrated in the single integrated circuit chip, the ring oscillator comprising a plurality of differential delay cells having respective pairs of input nodes and output nodes and connected in series to form a ring, each of the differential delay cells comprising:

a pair of input transistors having gates connected to respective ones of the input nodes, sources coupled with each other, and drains connected to respective ones of the output nodes;

a pair of voltage-controlled resistors connected between a power-supply line and respective ones of the output nodes, each of the voltage-controlled resistors having an effective resistance dependent on a first bias voltage; and a common current source that supplies a bias current controlled by a second bias voltage to the pair of input transistors; and a bias circuit integrated in the single integrated circuit chip, the bias circuit comprising:

a replica arm including a replica of one of the voltage-controlled resistors connected between the power-supply line and a first control node, and a first replica of the common current source that supplies a first replica bias current controlled by the second bias voltage to the replica of one of the voltage-controlled resistors;

a resistor arm including a pair of terminals to connect an off-chip fixed resistor between the power-supply line and a second control node, and a second replica of the common current source that supplies a second replica bias current controlled by the second bias voltage to the off-chip fixed resistor; and a control circuit that adjusts the second bias voltage such that voltages at the first and the second control nodes are the same, wherein the bias circuit supplies to the differential delay cells the first bias voltage from one of the first and the second control nodes and the second bias voltage from the control circuit.

14. The single-chip integrated circuit of claim 13, wherein the second replica bias current is larger than the first replica bias current.

15. A method to stabilize oscillation in a ring oscillator comprising a plurality of differential delay cells having respective pairs of input nodes and output nodes and connected in series to form a ring, each of the differential delay cells comprising a pair of input transistors having gates connected to respective ones of the input nodes, sources coupled with each other, and drains connected to respective ones of the output nodes, a pair of voltage-controlled resistors connected between a power-supply line and respective ones of the output nodes, each of the voltage-controlled resistors having an effective resistance dependent on a first bias voltage, and a common current source that supplies a bias current controlled by a second bias voltage to the pair of input transistors, the method comprising:

providing a bias circuit comprising:

a replica arm including a replica of one of the voltage-controlled resistors connected between the power-supply line and a first control node, and a first replica of the common current source that supplies a first replica bias current controlled by the second bias voltage to the replica of one of the voltage-controlled resistors;

a resistor arm including a fixed resistor connected between the power-supply line and a second control node, and a second replica of the common current source that supplies a second replica bias current controlled by the second bias voltage to the fixed resistor;

adjusting the second bias voltage such that voltages at the first and the second control nodes are the same; and supplying to the differential delay cells the first bias voltage from one of the first and the second control nodes and the adjusted second bias voltage.

16. The method of claim 15, wherein the providing is performed such that the second replica bias current is larger than the first replica bias current.

17. The method of claim 15, wherein the providing is performed such that the second replica of the common current source includes a switch to change a ratio between the second replica bias current and the bias current of the differential delay cell.

18. The method of claim 15, wherein the providing is performed such that the delay cells and the bias circuit, except for the fixed resistor, are integrated in a single integrated circuit chip, and the fixed resistor is provided as an off-chip resistor.

19. A method to stabilize oscillation in a ring oscillator comprising a plurality of differential delay cells having respective pairs of input nodes and output node and connected in series to form a ring, each of the differential delay cells comprising a pair of input transistors having gates connected to respective ones of the input nodes, sources coupled with each other, and drains connected to respective ones of the output nodes, a pair of voltage-controlled resistors connected between a power-supply line and respective ones of the output nodes, each of the voltage-controlled resistors having an effective resistance dependent on a first bias voltage, and a common current source that supplies a bias current controlled by a second bias voltage to the pair of input transistors, the method comprising:

providing a bias circuit comprising a replica arm including a replica of one of the voltage-controlled resistors connected between the power-supply line and a first control node, and a first replica of the common current source that supplies a first replica bias current controlled by the second bias voltage to the replica of one of the voltage-controlled resistors;

adjusting the second bias voltage such that an effective resistance of the replica of one of the voltage-controlled resistors is equal to a predetermined value; and supplying to the differential delay cells the first bias voltage from the first control node and the adjusted second bias voltage.

20. The method of claim 19, wherein:

the providing is performed such that the bias circuit further comprises a resistor arm including a fixed resistor connected between the power-supply line and a second control node, and a second replica of the common current source that supplies a second replica bias current controlled by the second bias voltage to the fixed resistor; and the adjusting is performed such that voltages at the first and the second control nodes are the same.

21. The method of claim 20, wherein the providing is performed such that the delay cells and the bias circuit, except for the fixed resistor, are integrated in a single integrated circuit chip, and the fixed resistor is provided as an off-chip resistor.

* * * * *